(12) United States Patent
Bude et al.

(10) Patent No.: US 11,222,734 B2
(45) Date of Patent: Jan. 11, 2022

(54) BURST-MODE CHIRPED PULSE AMPLIFICATION METHOD

(71) Applicant: LAWRENCE LIVERMORE NATIONAL SECURITY, LLC, Livermore, CA (US)

(72) Inventors: Jeffrey D. Bude, Danville, CA (US); David A. Alessi, Livermore, CA (US); Maurice B. Aufderheide, Livermore, CA (US); John E. Heebner, San Ramon, CA (US); Andreas J. Kemp, Livermore, CA (US); Otto L. Landen, Hayward, CA (US); Andrew J. Mackinnon, Livermore, CA (US); Raluca A. Negres, Pleasanton, CA (US); Craig W. Siders, Livermore, CA (US); Scott C. Wilks, Mountain View, CA (US); Wade H. Williams, Manteca, CA (US); Steven T. Yang, Danville, CA (US); Thomas M. Spinka, Livermore, CA (US)

(73) Assignee: LAWRENCE LIVERMORE NATIONAL SECURITY, LLC, Livermore, CA (US)

( * ) Notice: Subject to any disclaimer, the term of this patent is extended or adjusted under 35 U.S.C. 154(b) by 256 days.

(21) Appl. No.: 16/510,082

(22) Filed: Jul. 12, 2019

(65) Prior Publication Data
US 2020/0020459 A1 Jan. 16, 2020

Related U.S. Application Data

(60) Provisional application No. 62/697,571, filed on Jul. 13, 2018.

(51) Int. Cl.
*G21K 5/02* (2006.01)
*H01S 3/23* (2006.01)
*H01S 3/00* (2006.01)
*H01S 3/067* (2006.01)
(Continued)

(52) U.S. Cl.
CPC .............. *G21K 5/02* (2013.01); *H01S 3/0057* (2013.01); *H01S 3/06758* (2013.01);
(Continued)

(58) Field of Classification Search
CPC ....... G21K 5/02; H01S 3/2316; H01S 3/0057; H01S 3/2308; H01S 3/06758;
(Continued)

(56) References Cited

U.S. PATENT DOCUMENTS 7,787,175 B1 * 8/2010 Brennan, III ...... B23K 26/0624
359/333
2008/0013163 A1 1/2008 Leonardo et al.
(Continued)

OTHER PUBLICATIONS

Internaticna Search Report and Written Opinion for PCT/US2019/041721 corresponding to U.S. Appl. No. 16/510,082, 9 pages, dated Oct. 30, 2019.
(Continued)

*Primary Examiner* — Kiet T Nguyen
(74) *Attorney, Agent, or Firm* — Ladas & Parry, LLP (57) ABSTRACT

A method for increasing the MeV hot electron yield and secondary radiation produced by short-pulse laser-target interactions with an appropriately high or low atomic number (Z) target. Secondary radiation, such as MeV x-rays, gamma-rays, protons, ions, neutrons, positrons and electromagnetic radiation in the microwave to sub-mm region, can be used, e.g., for the flash radiography of dense objects.

25 Claims, 10 Drawing Sheets

(51) Int. Cl.
*H01S 3/13* (2006.01)
*H01S 5/00* (2006.01)
*H01S 3/10* (2006.01)
*H01S 5/50* (2006.01)

(52) U.S. Cl.
CPC ...... *H01S 3/10007* (2013.01); *H01S 3/10023* (2013.01); *H01S 3/1301* (2013.01); *H01S 3/2316* (2013.01); *H01S 5/0057* (2013.01); *H01S 5/5018* (2013.01); *H01S 5/5027* (2013.01)

(58) Field of Classification Search
CPC ............. H01S 3/10007; H01S 3/10023; H01S 3/1301; H01S 5/0057; H01S 5/5018; H01S 5/5027; H01J 35/065; H05H 6/00; H05H 15/00; H05G 2/00
USPC .................................................. 372/30, 25, 6
See application file for complete search history.

(56) References Cited

U.S. PATENT DOCUMENTS

| | | | |
|---|---|---|---|
| 2009/0246413 A1* | 10/2009 | Murakami | C23C 14/08 427/596 |
| 2009/0246530 A1* | 10/2009 | Murakami | C23C 14/54 428/411.1 |
| 2011/0182306 A1 | 7/2011 | Hosseini et al. | |
| 2014/0002927 A1 | 1/2014 | Wong et al. | |
| 2016/0084892 A1 | 3/2016 | Courjaud | |
| 2017/0085053 A1 | 3/2017 | Fermann | |

OTHER PUBLICATIONS

International Preliminary Report on Patentability from PCT/US2019/041721, dated Jan. 19, 2021.

* cited by examiner

BURST-MODE CHIRPED PULSE AMPLIFICATION METHOD

CROSS-REFERENCE TO RELATED APPLICATIONS

This application claims the benefit of U.S. Provisional Patent Application No. 62/697,571 titled "Burst-Mode Chirped Pulse Amplification for Increased Laser-Driven MeV Hot Electron and Secondary Photon and Particle Generation," filed Jul. 13, 2018, incorporated herein by reference.

STATEMENT AS TO RIGHTS TO INVENTIONS MADE UNDER FEDERALLY SPONSORED RESEARCH OR DEVELOPMENT

The United States Government has rights in this invention pursuant to Contract No. De-AC52-07NA27344 between the United States Department of Energy and Lawrence Livermore National Security, LLC, for the operation of Lawrence Livermore National Laboratory.

BACKGROUND

Field

The present technology relates to chirped pulse amplification systems, and more specifically, relates to technology for increasing the MeV hot electron yield produced by short-pulse laser-target interactions over that produced by high-energy chirped pulse amplification systems.

Description of Related Art

It has long been known that short pulses less than about 30 ps can be used to create hot electrons through the interaction of the laser pulse with a target. Perry et al. [1] showed that using chirped pulse amplification (CPA), laser pulses with an intensity greater than about $10^{19}$ W/cm$^2$ could efficiently produce MeV electrons. They further showed that some of the energy of these electrons could be used to produce MeV x-rays (gamma rays) through their interaction (Bremsstrahlung) with an element having a high atomic number (a high Z target). Since the advent of CPA and laser pulses to sub-30 ps, MeV x-ray sources are now regularly produced in the laboratory [2-5]. Courtois et al. [4-5] showed that the interaction of 10 ps, 1 kJ laser pulses with a Ta target (Z=73) could produce sufficient MeV x-ray radiation to form a reasonably good radiograph of a dense object with an areal mass density up to 85 g/cm$^2$. In many cases, it is desirable to increase the prompt MeV x-ray dose beyond that produced by the Courtois experiments to improve image quality, reduce signal-to-noise and to radiograph more dense objects. One way to achieve this would be to increase the energy of the 10 ps pulse.

Figure 1:
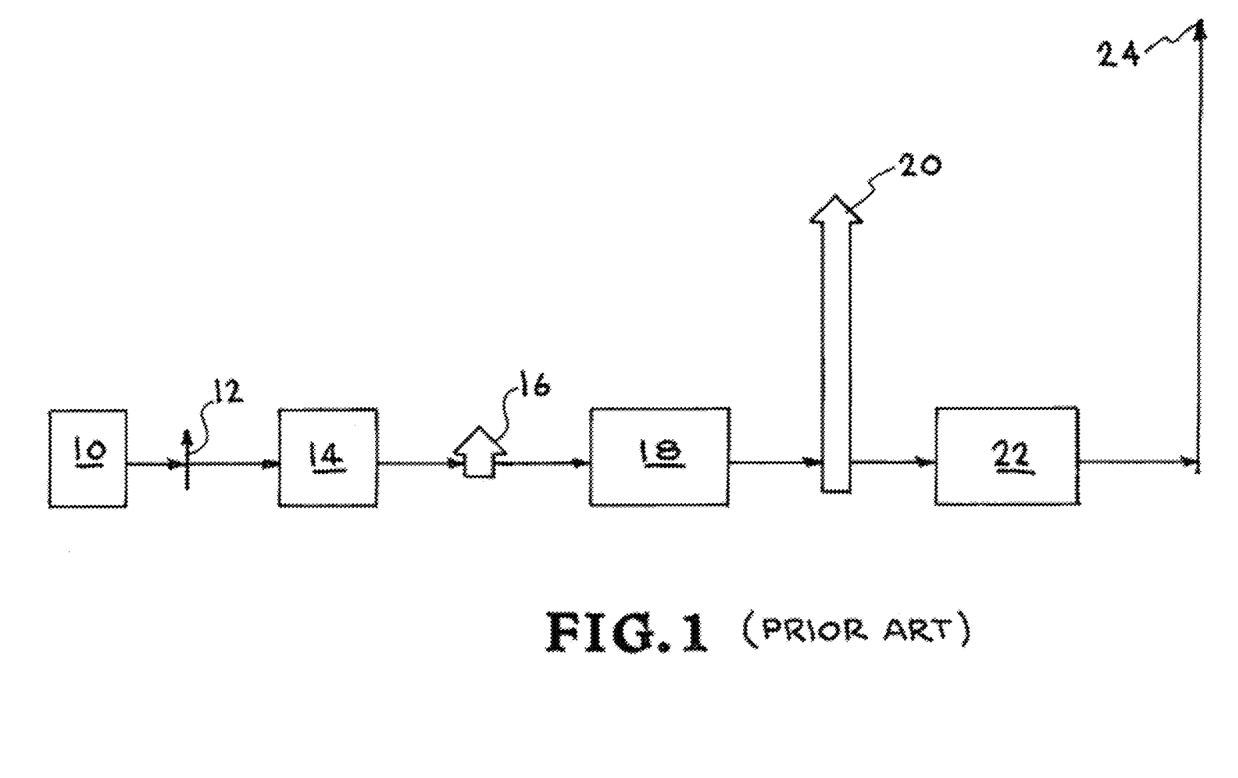
FIG. 1 illustrates the propagation of a pulse through a chirped pulse amplifier.

Chirped pulse amplification (CPA) is currently considered to be the most efficient way to produce high energy, high power short laser pulses. It was introduced to get past an important limitation encountered when short laser pulses are amplified to higher energies: non-linear beam distortion and destructive self-focusing. FIG. 1 illustrates the propagation of a pulse through a chirped pulse amplifier. As shown in the figure, a laser front end 10 produces a low energy short pulse "seed" 12 which, in this example, is a 10 nJ, 10 ps pulse. Seed 12 is stretched in time by stretcher 14 to produce a 1.5 ns stretched pulse 16. Amplifier 18, which may consist of one to several intermediate stages of amplification, amplifies pulse 16 to produce a 1 kJ, 1.5 ns high energy stretched pulse 20. Compressor 22 compresses the pulse in time back to 10 ps. Thus, the output pulse from compressor 22 is a high energy compressed pulse 24 having an energy of up to 1 kJ and a pulse duration of 10 ps. The amplified short pulses are then typically directed and focused by suitable reflective optics sometime referred to as final optics such that they strike a target where they produce high energy (typically MeV) hot electrons.

When a short, intense (high power density, I, in e.g., W/cm$^2$) laser pulse passes through an amplifying medium, it begins to acquire additional phase from the non-linear index of refraction often denoted as the B-integral, with B~$2\pi n_2$ IL/$\lambda$, where $n_2$ is the non-linear index of refraction, L is the path length through the amplifying medium, and $\lambda$ is the laser wavelength). This process (known as the Kerr effect) seeds instabilities in the beam resulting in distortion and ultimately, in a collapse into localized destructive filaments. CPA reduces these non-linear effects through as laser architectural method known as chirped pulse amplification. In CPA, a short, low energy chirped pulse of length $\tau 0$ (the "seed pulse") is first stretched in duration, using diffraction gratings or long lengths of dispersive material, to a longer pulse length ($\tau$_stretch) which is typically nanoseconds length. The intensity of the stretched pulse, I_stretch, is reduced by the ratio of $\tau$_stretch to $\tau 0$ so that it can be safely amplified without exceeding the B-integral limit of the amplifier. The stretched pulse is then passed through an amplifier medium amplifying it to higher energy. The longer wavelengths of the stretched pulse appear first in time, and the shorter wavelengths appear last. Finally, the amplified stretched pulse is passed through a pulse compressor comprised of diffraction gratings which are tuned so that the leading longer wavelengths of the pulse see a greater path length than the later shorter wavelengths such that they reach the final grating at nearly the same time where they are "recombined" to form an energetic pulse with the desired, much shorter pulse length ($\tau$_compress). The energetic, compressed pulse can then be directed and focused onto a target by suitable reflective optics sometime referred to as final optics where it reaches an intensity high enough for ionization, plasma formation, and hot electron generation. In CPA systems, the maximum energy of the compressed pulse is limited by two factors: B-integral in the amplifier 18 and damage to the final optics, the compressor 22 and/or focusing optic. These limits on energy are often far below (e.g., 10 times below) the available stored energy in the stretched pulse amplifier making CPA an inefficient process.

In traditional CPA, the only way to increase short pulse energy is to run many beamlines in parallel: for example, to double the short pulse energy requires two of every component in the chain—two short pulse front-ends to form the seed pulses, two stretchers, two amplifiers, two compressors, and two focusing optics. This is clearly highly inefficient in terms of system cost and size. Hence, a new approach is needed to extract more of the stored energy in the amplifier without violating B-integral and final optics damage limits.

SUMMARY

The present technology is directed to a method for increasing the MeV hot electron yield produced by short-pulse (less than about 100 ps) laser-target interactions over that produced by conventional methods that utilize high-energy chirped puke amplification (CPA) systems. These hot electrons can be subsequently used to create useful secondary or tertiary radiation, such as MeV x-rays, gamma-rays, protons, ions, neutrons and positrons, and electromagnetic radiation in the microwave to sub-mm region, produced through the interaction of such hot electrons with an appropriately high or low atomic number (Z) target (depending on the particular secondary source) which can be used, e.g., for the flash radiography dense objects using MeV x-rays. In this context, flash radiography is the radiography of objects which change in time done with a short burst (e.g. less than 100 ns) of x-rays source. CPA is considered to be the method of choice for amplifying short pulses to the high energy (kilojoule class) and peak power levels (10-TW to multi-PW) on a target needed for efficient production of a useful dose of hot electrons (and secondary radiation). However, because of non-linear effects in the main amplifier accumulation of B-integral), and the optical damage limits of the final compression and focusing optics, CPA is an inefficient process that leaves gain in the main amplification stage that cannot be extracted to produce short-pulses without incurring either deleterious effects to the laser pulse or outright damage of the amplifier media, compressor optics or the final optics which include focusing, optics and transport optics. The present technology, referred to sometimes herein as Burst-Mode CPA (BM-CPA), provides a means to extract this gain through the amplification of a burst of short pulses. It relies on the discovery that the maximum energy the final optics can handle without damage is increased by introducing that energy in a burst of short pulses, each separated from the other by a delay on the order of a nanosecond. The short pulses in the burst can be focused onto the target in such a manner that the sum of hot electrons produced by the burst is much greater than the number produced by the interaction of a single pulse with the target. This magnification of hot electron dose can be achieved by ensuring that each of the pulses strike the target at points separated by distances sufficient to avoid laser plasma interactions between the pulses. This method further provides a practical means to address this spacing need on target through small angle multiplexing of the pulses injected into the main amplifier. This method is sometimes referred to herein as Angularly Multiplexed Burst-mode CPA, or AMB-CPA. It further provides a practical means to reduce the laser plasma interaction between strike points on the target by using recessed targets or individual targets isolated by cones.

The present technology can be implemented through front-end modifications to existing (or new) short pulse lasers such as National Ignition Facility-Advanced Radiographic Capability (NIF-ARC) laser at Lawrence Livermore National Laboratory (LLNL) or the short-pulse beam-lines on the Omega laser at the Laboratory for Laser Energetics (LLE). Recessed targets or targets with isolation cones as described above can be implemented on any high-Z target.

Example uses of the present technology include, but are not limited to, short-pulse lasers, laser-driven flash x-ray radiography and laser-driven flash particle production.

BRIEF DESCRIPTION OF THE DRAWINGS

The accompanying drawings, which are incorporated into and forms a part of the disclosure, illustrate an embodiment of the invention and, together with the description, serves to explain the principles of the invention.

DETAILED DESCRIPTION OF THE TECHNOLOGY

Figure 2A:
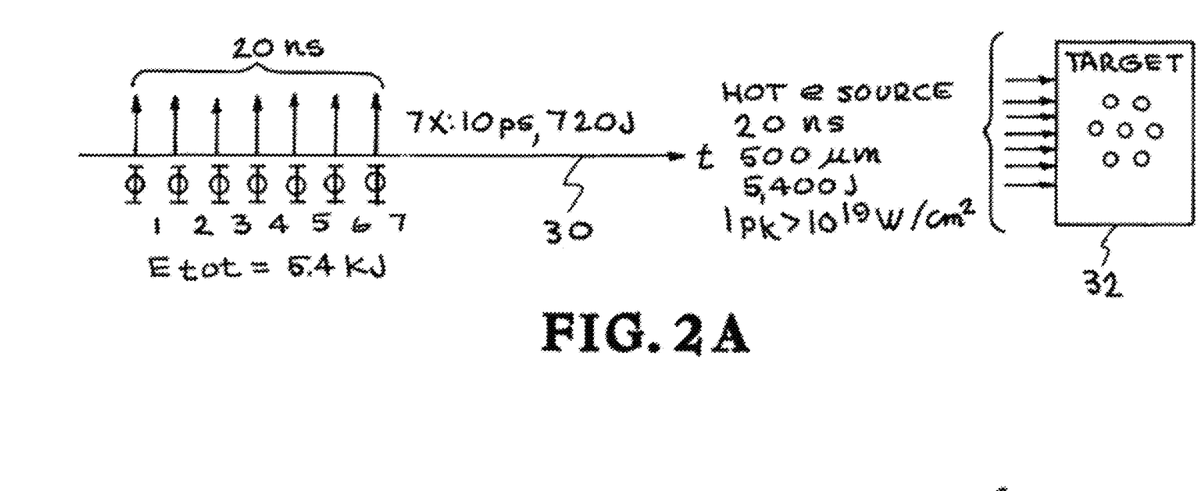
FIG. 2A shows the output of a BM-CPA system.
Figure 2B:
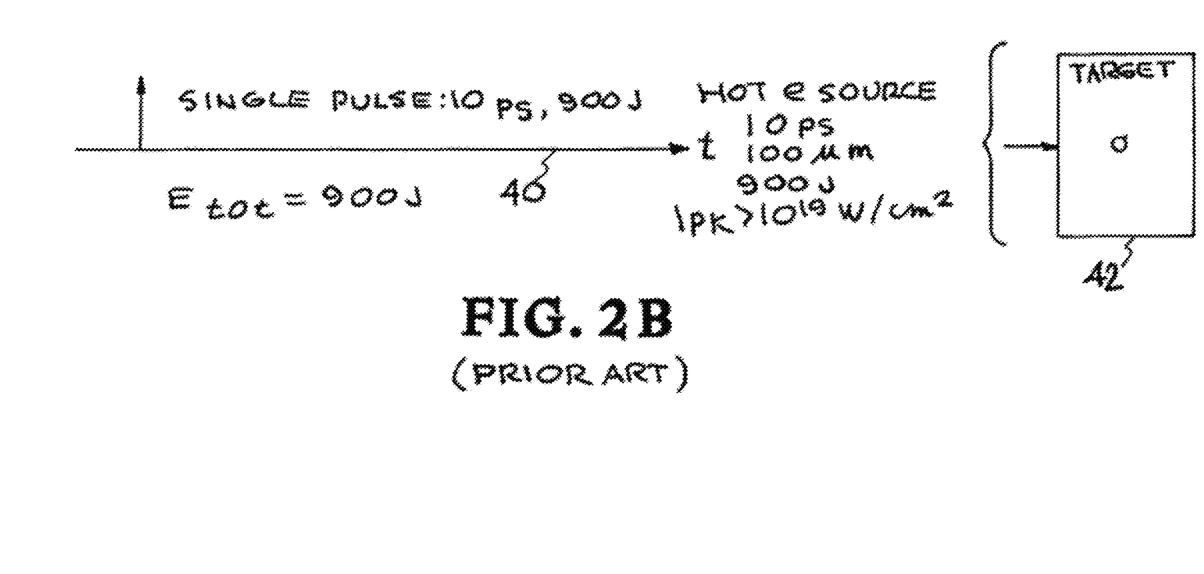
FIG. 2B shows the output of a conventional CPA system.

The present technology provides a method for extracting more energy from a CPA system, making it more efficient and reducing the size of the ultimate system required for a given need. The current invention is based on the discovery that the maximum energy the final optics can handle without damage is increased by introducing that energy in a burst of short pulses, each separated from the other by a delay on the order of a nanosecond. The energetic pulses in the burst are arranged such that they strike the target at locations far enough apart that laser-plasma interactions between them have a minimal impact on the efficiency of hot electron production. The duration of the hot electron burst will be equal in time to the duration of the laser pulse burst and can still be sufficiently prompt for flash radiography. The source size in space will be approximately equal to the area of the target struck by the laser pulses in the burst. FIG. 2A shows the output 30 of a BM-CPA system. A series of seven pulses is directed onto a hot electron target 32. FIG. 2B shows the output 40 from a conventional CPA system. The output is directed and focused by suitable reflective optics sometime referred to as the final optics onto a hot electron target 42. The amplifier and final optics, diffraction gratings and focusing optic (not shown), are the same in both FIG. 2A and FIG. 2B. Pulses are drawn to comply with the B-integral and final optics damage limits of the same, typical CPA output stage.

Figure 3:
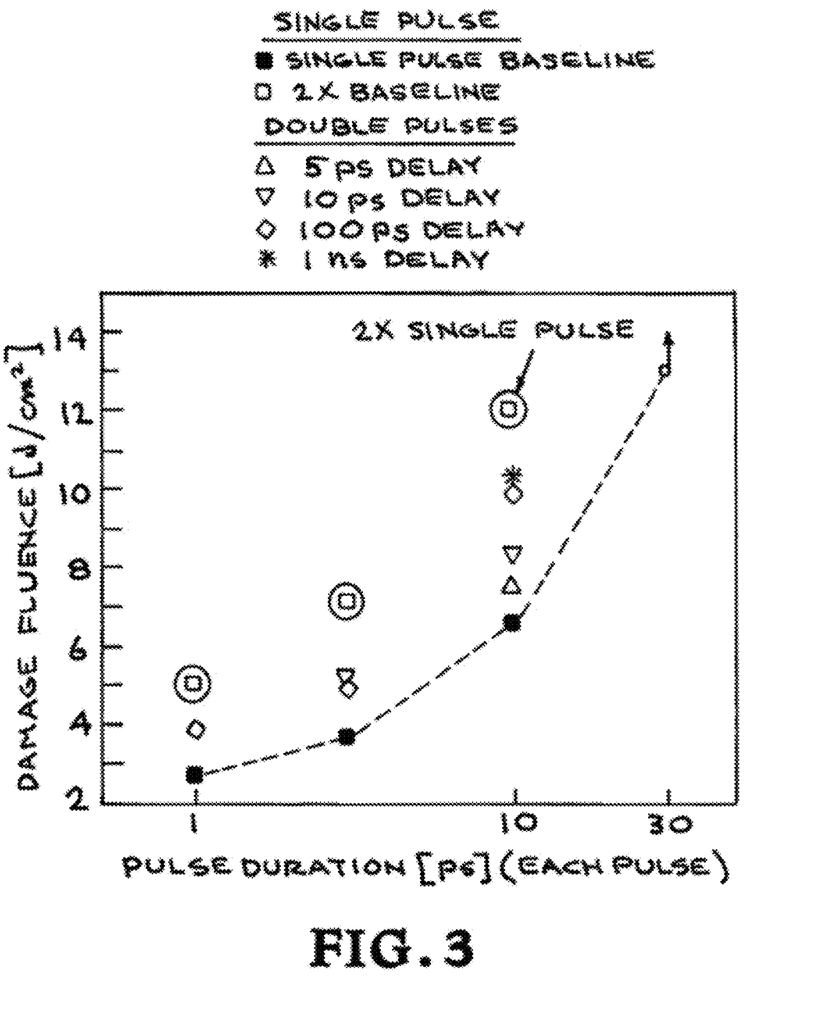
FIG. 3 is a plot showing the damage threshold of pulse doublets as a function of delay and as a function of the pulse length of each of the constituent pulses and was compared to twice the damage threshold of the material at the corresponding pulse length.

In support of the BM-CPA concept, experiments were performed to test the damage threshold of a multi-layer dielectric (MLD) reflector typical of those used in CPA compressor gratings (used, for example, in compressor 22 for FIG. 1) or in the other final optics used for directing and focusing the short pulse on a target when struck by two identical (in pulse length, wavelength, and beam size) short laser pulses pointed at the same physical point on the MLD reflector and separated in time by a delay line. FIG. 3 is a plot showing the damage threshold of these pulse doublets as a function of delay and as a function of the pulse length of each of the constituent pulses and was compared to twice the damage threshold of the material at the corresponding pulse length. It was found that the damage threshold of the MLD reflector increased for delays greater than about 5 ps. For 10 ps pulses (the pulse length of those used in the Courtois experiments cited above) and a delay of 100 ps between the pulses, the MLD reflector could withstand 80% of the double-single puke limit—in other words, from the point of view of laser damage, the MLD reflector responded to the second pulse nearly as if the first pulse hadn't arrived before it. From this result, it is determined that a burst of 10 ps pulses having delays greater than about 100 ps could be safely used in a compressor, each having 80% of the damage limit of a single 10 ps pulse. Further burst mode damage tests using a different MLD reflector done with a burst of four 10 ps long pulses having an inter-pulse spacing of about 3 ns between them had a damage threshold of about 11.8 $J/cm^2$, whereas the damage threshold of a single pulse was about 3.4 $J/cm^2$. This result indicates that the burst-mode damage threshold of the MLD reflector is about 3.5 times higher than a single pulse, and a BM-CPA system using this burst could produce 3.5 times more energy and more MeV electrons than a conventional CPA system using a single pulse. All short pulse optics operated post-amplification are of a similar design and composition as these MLD reflectors and would have similar damage behavior.

Figure 4A:
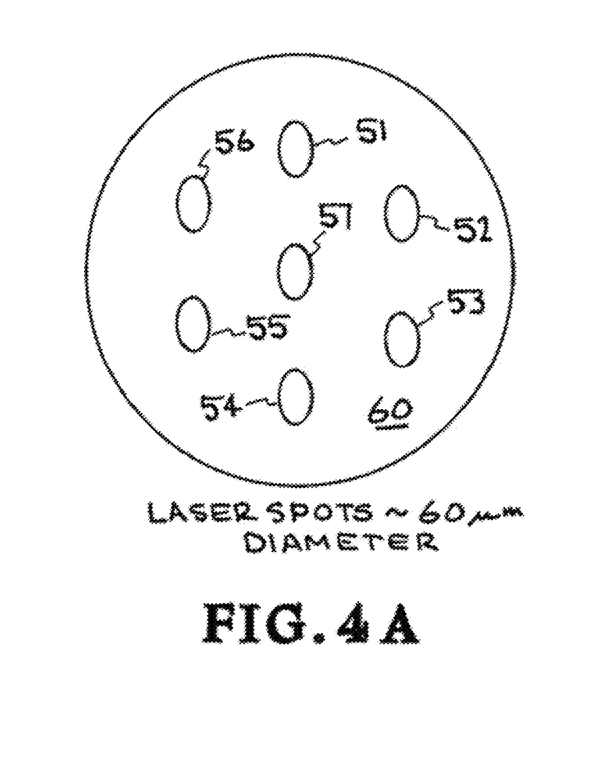
FIG. 4A shows a front view of the laser spots on the High-Z convertor material.
Figure 4B:
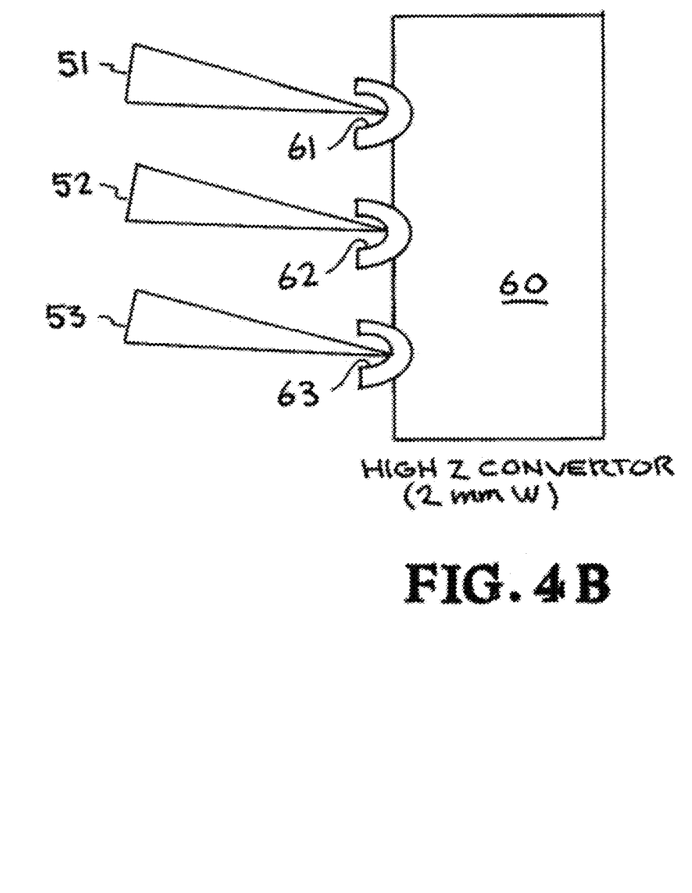
FIG. 4B shows a side view of three laser pulses focused in respective isolation cones in the high-Z convertor material.

Embodiments of this technology focus each spot on the target so that they are all far enough apart that there is minimal laser-plasma interaction between the pulses which arrive at different times. FIG. 4A shows a front view of the laser spots 51-57 on the High-Z convertor material. 60. Note that the spots have a diameter of about 60 µm and are 160 µm apart on the High-Z convertor material 60, which is 500 µm in diameter. FIG. 4B shows a side view of laser pulses 51-53 of FIG. 4A. Laser pulses 51-53 are focused in respective isolation cones 61-63 either in or on the high-Z convertor material 60. Laser pulse 51 arrives at the target at time $T_0$. Pulse 52 and 53 arrive at the target at $T_0$ plus 1 ns and $T_0$ plus 2 ns, respectively. Pulses 54-57 arrive at the target at $T_0$ plus 3 ns to $T_0$ plus 7 ns. respectively. Note that the ordering of these pulses described here is not necessarily the only optimal sequencing. There are a variety of ways to make the isolation cones. For example, the isolation cones may consist of a re-entrant hole in high-Z converter material, or they may be cones placed on the high-Z material. The cone in this second case may be formed in plastic and coated for high reflection with gold or another reflective material. An exemplary hydro-dynamic simulation of the plasma interaction along its radial axis revealed that the separation between pulse spots can be on the order of hundreds of microns when the compressed pulse length is 10 ps and the delay between pulses in the burst is a nanosecond. Another exemplary hydro-dynamic simulation showed a reduced laser plasma interaction radius produced when a pulse is focused into a re-entrant hole or an isolating cone. Thus, the separation between each pulse may be reduced further by focusing the beams into re-entrant holes or isolation cones. The "exclusion zone" between pulses could change as a function of the compressed pulse length, the delay between pulses, the construction of the isolation cones, and the compressed pulse energy.

In an embodiment of the present technology, this spatial separation can be achieved through angular multiplexing of the beams. This embodiment of BM-CPA is sometimes referred to as Angularly Multiplexed Burst-mode CPA (AMB-CPA). In this approach, each pulse in the beam is formatted with a slightly different angle (Φ) in the "front-end" of the laser prior to its injection into the amplification chain. The beams propagate with these different angles throughout the system, from the stretcher to the amplifier to the compressor and finally out the focusing optic. These angles are arranged such that when the pulses leave the focusing optic, they are focused into the correct pattern on the target. A desirable pulse strike delay pattern for a seven-pulse burst of these pulses on the target is shown in FIG. 4B.

Figure 5A:
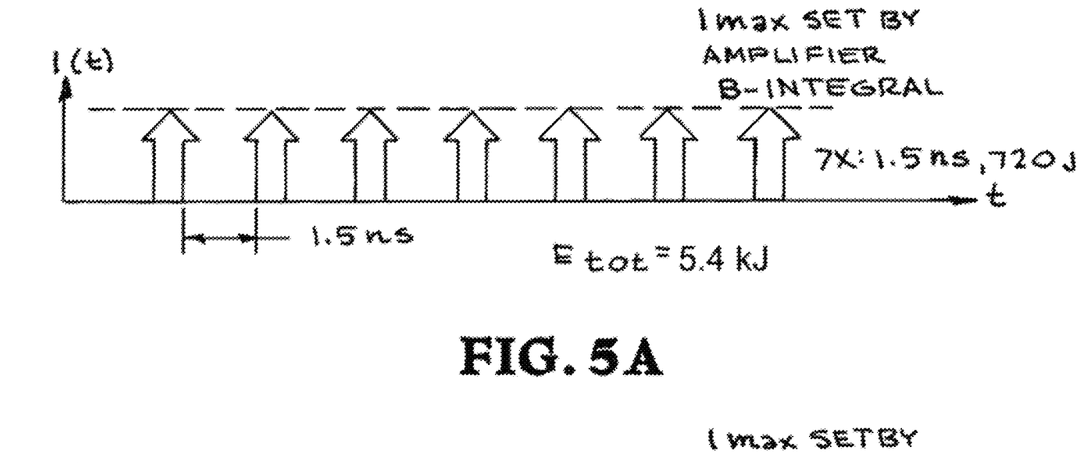
FIG. 5A shows a burst of seven stretched pulses after amplification in the main amplification stage of a BM-CPA system.
Figure 5B:
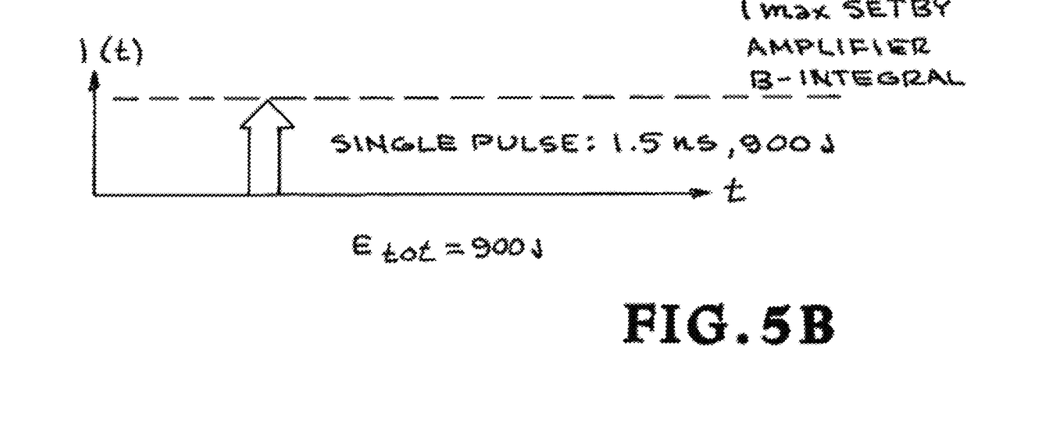
FIG. 5B shows a single pulse from the same amplifier of FIG. 6A but used in the traditional CPA approach.

FIG. 5A shows a burst of seven stretched pulses after amplification in the main amplification stage but prior to compression of a BM-CPA system compared to a single pulse used in the same amplifier in the traditional CPA approach of FIG. 5B. The intensity of each stretched pulse in FIG. 5A is maintained below maximum allowable B-integral limit of the amplifier, and the angles are chosen to hit the target as shown in FIG. 4A. In this example, the 1.5 ns duration stretched pulses are separated by 1.5.ns. The energy of each pulse in FIG. 5A is 80% of the pulse in FIG. 5B so that upon compression, each pulse in the burst is below the damage threshold of the short pulse optics as described above. The total short pulse energy delivered to the target in FIG. 5A is 5.6 times (5.6=0.8*7) the pulse energy delivered by the same amplifier used in the traditional CPA approach so that the MeV electron dose and secondary particle (x-ray) doses are 5.6 times what could be produced in the traditional CPA method of FIG. 5B.

Figure 6:
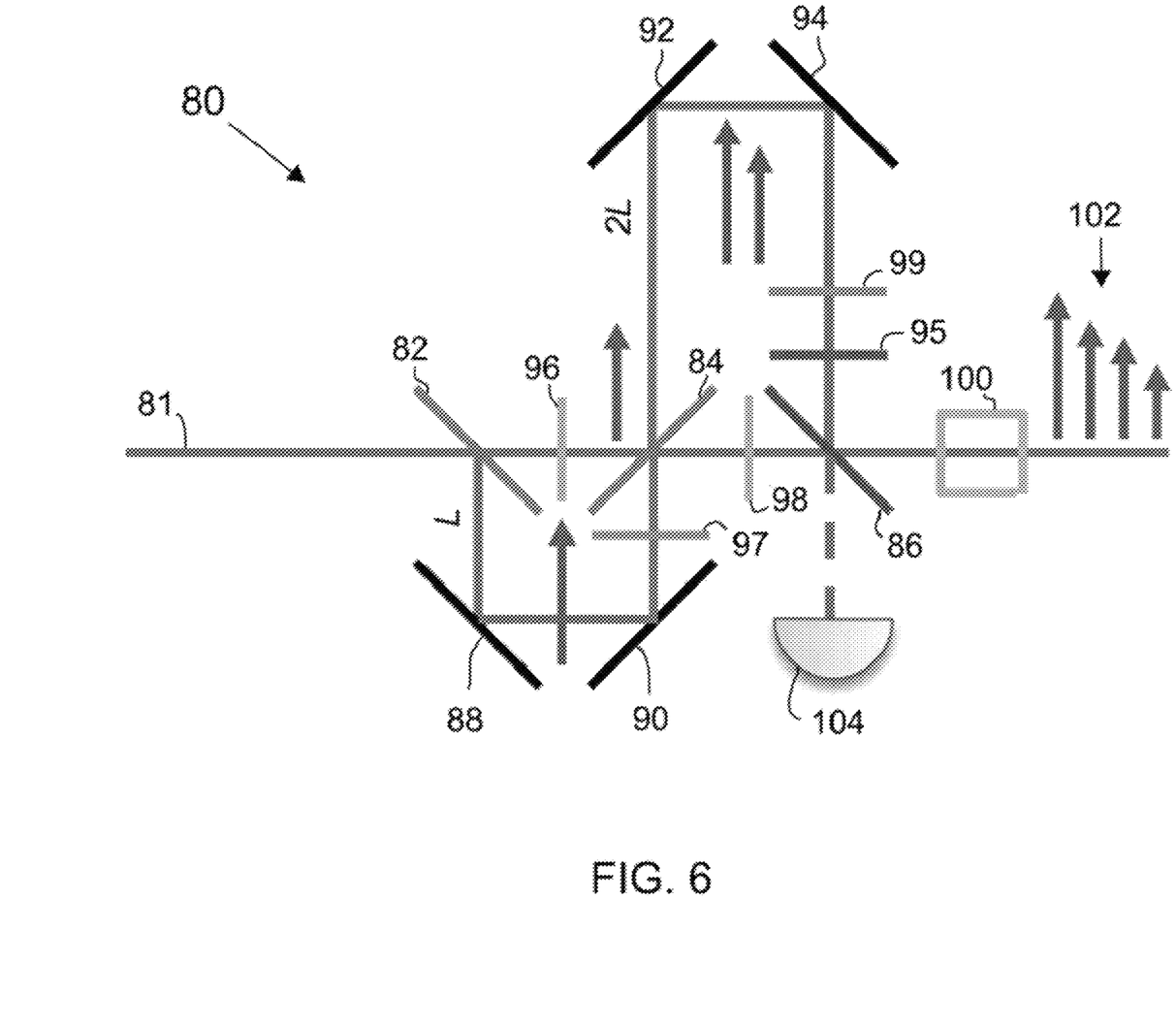
FIG. 6 illustrates an exemplary burst generator.

An exemplary burst generator 80 is shown in FIG. 6. Generally, this figure depicts an example of technology that will take an input pulse of light and produce an output series of pulses, such as, for example, shown in FIGS. 2A and 5A. The output of this device can be directed at different angles such that each pulse of the series of pulses propagates through the final amplifier of a CPA system at a slightly different angle from that of each other pulse of the series of pulses. Specifically, FIG. 6 shows a hyper-Michelson interferometer layout that creates four equally-spaced pulses in time. Based on this disclosure, those skilled in the art will understand that this concept, as well as alternate configurations, can be used to produce a desired number of output pulses and a desired spacing in time of such pulses. In the figure, a single input pulse 81 is directed onto beamsplitter (BS) 82. The burst generator further includes BS 84, BS 86, mirrors 88, 90, 92 and 94. In this example, the device includes neutral density (ND) filters 96-99, a polarizer 95 and a Pockets Cell 100. The combination of ND filters contributes to produce a series of output pulses 102 that are progressively increasing in intensity. This progressive increase in intensity may be useful in accessing more power from a subsequent amplifier, as well as preventing damage therein and in the compressor and subsequent optic. This device includes a beam diagnostic package 104. Given the positioning of the elements, one can see how input pulse 81 will propagate through the system to produce a series of output pulses 102. This configuration was chosen in this case to produce a desired spacing between the output pulses. The pointing of the output beam can be changed in a variety of ways such that each pulse of the series of output pulses can be directed at slightly different angles into a subsequent amplifier, such as the final amplifier of a CPA system. For example, a slight change in the angular orientation of the beamsplitters repoints the far field of each pulse of the series of pulses. Those skilled in the art will understand other ways to change the pointing of the output series of pulses.

Figure 7A:
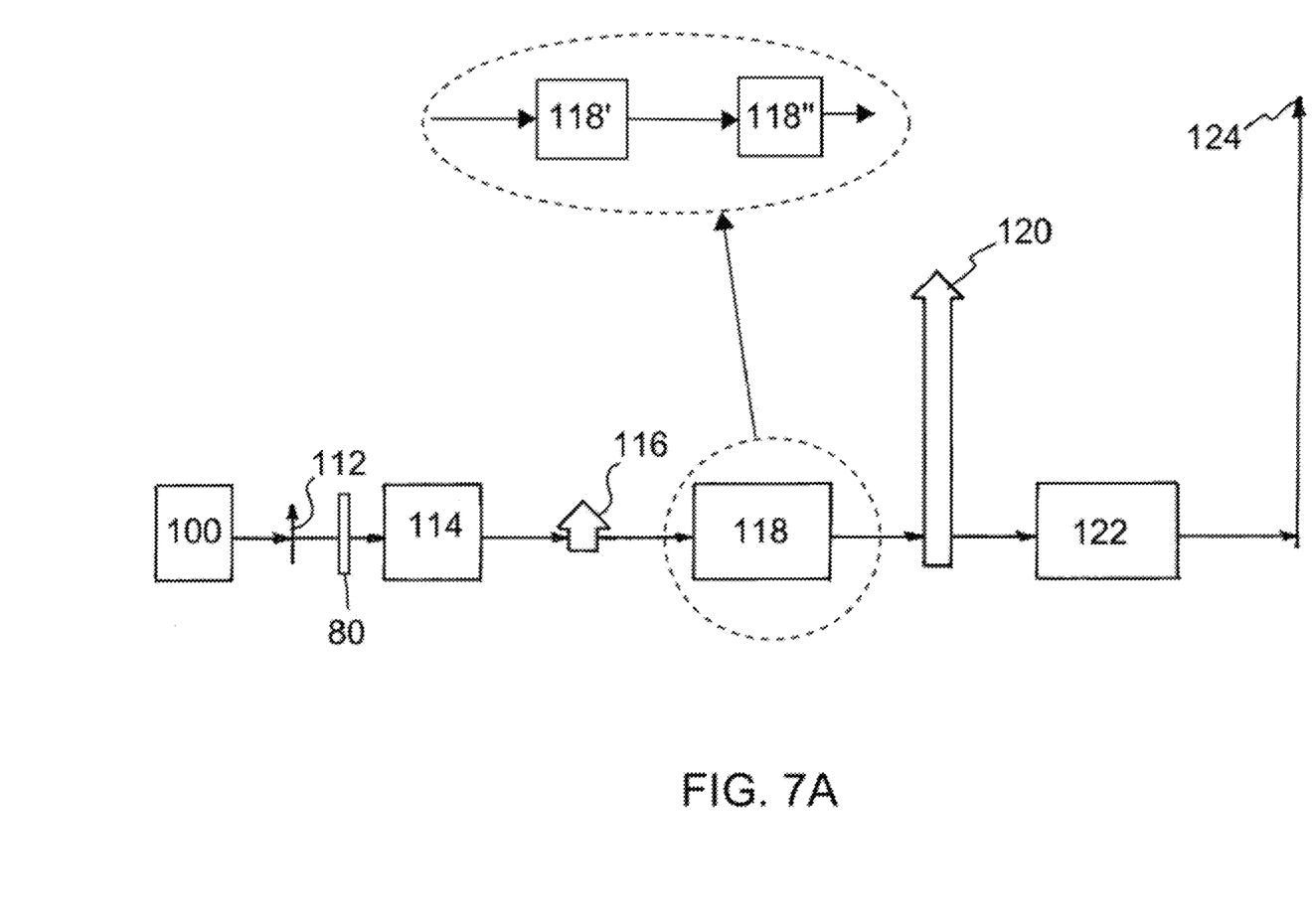
FIGS. 7A-7D depict exemplary alternate configurations of the present technology.

FIGS. 7A-7D depict exemplary alternate configurations of the present technology. The configurations place the burst generator 80 at alternate locations within a CPA system. The alternate configurations, which consists of alternate burst generator positions within the CPA system, are listed as examples 1-4 as follows:

Example 1 of FIG. 7A in general is a block diagram showing a single seed pulse, a burst generator, a stretcher, an amplifier (pre and final) and a compressor. All systems of examples 1-4 (FIGS. 7A-7D) are followed by focusing optics for directing the pulses onto the target (not shown) such as target 60 of FIGS. 4A and 4B. In this configuration, a laser front end 100 produces a low energy short pulse "seed" 112. Seed pulse 112 passes through burst generator 80 to produce a series of short pulses which are stretched in time by stretcher 114 to produce a series of stretched pulses 116. Amplifier 118, which may include a preamplifier 118' and a final amplifier 118", amplifies the series of stretched pulses 116 to produce a series of stretched pulses 120. Compressor 122 compresses series of amplified pulses 120 in time to produce a series of compressed pulses 124.

Figure 7B:
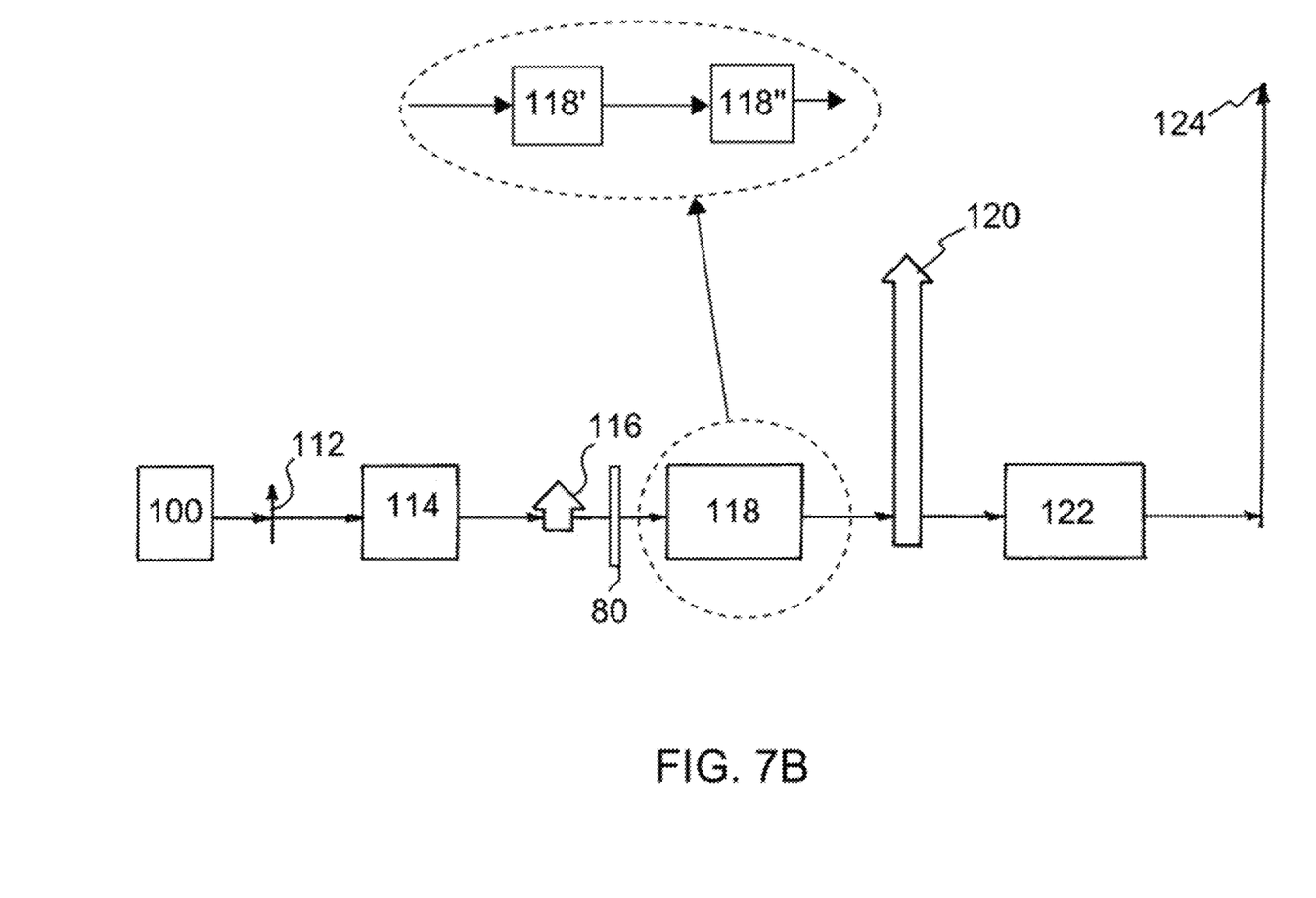

Example 2 of FIG. 7B in general is a block diagram showing a single seed pulse, a stretcher, a burst generator, an amplifier (pre and final) and a compressor. In this configuration, a laser front end 100 produces a low energy short pulse "seed" 112. Seed 112 passes through pulse stretcher 114 to produce a stretched pulse 116 which then passes through burst generator 80 to produce a series of stretched pulses which are then directed through amplifier 118. Amplifier 118, which may include a preamplifier 118' and a final amplifier 118", amplifies pulses 116 to produce a series of amplified pulses 120. Compressor 122 compresses the pulses in time. Thus, the output pulses from compressor 122 are a series of compressed pulses 124.

Figure 7C:
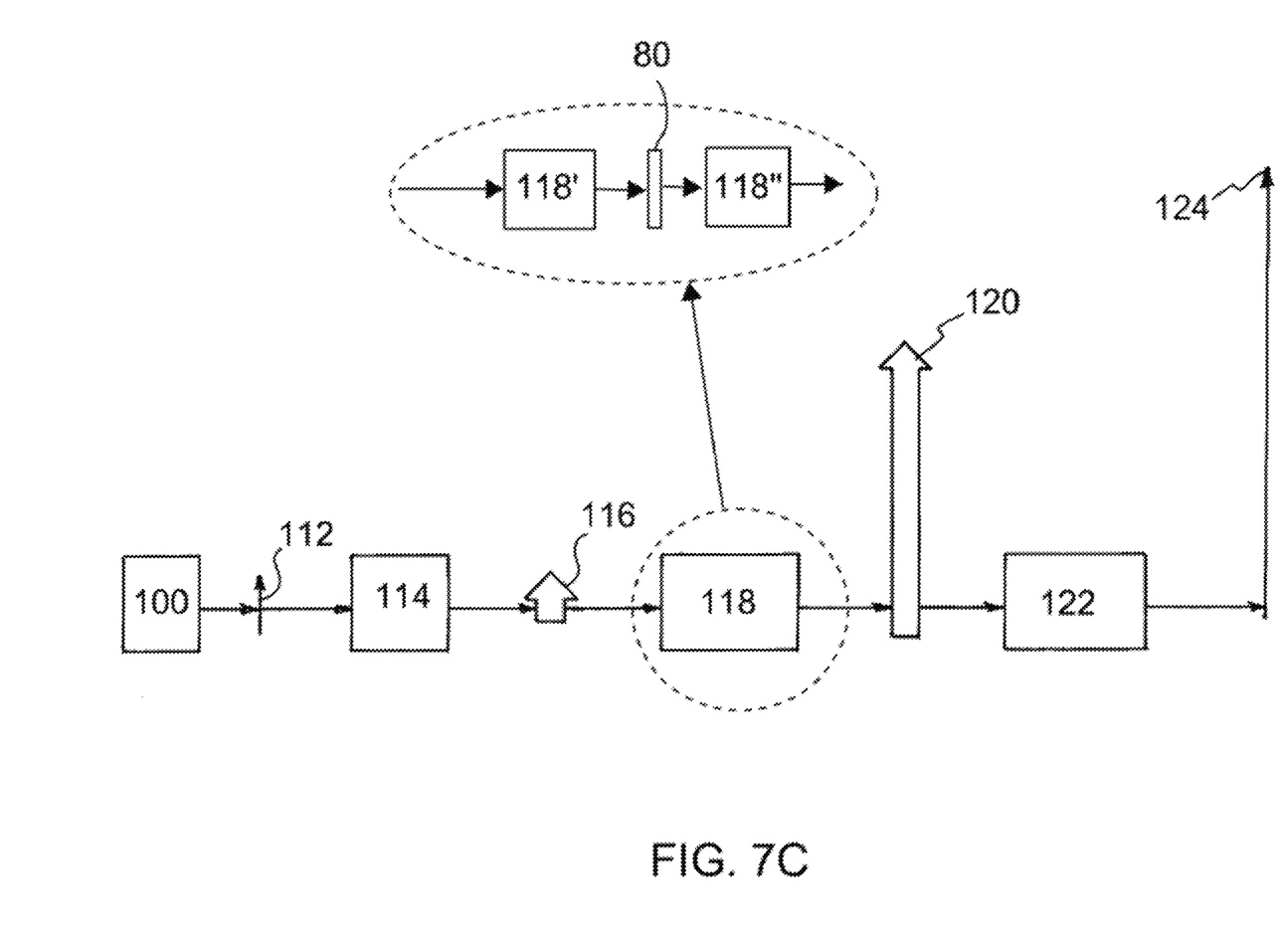

Example 3 of FIG. 7C in general is a block diagram showing a single seed pulse, a stretcher, a pre-amplifier, a burst generator, a final amplifier and a compressor. In this configuration, a laser front end 100 produces a low energy short pulse "seed" 112. Seed 112 passes through pulse stretcher 114 to produce a stretched pulse 116 which, as shown in the insert, then passes through preamplifier 118' and then burst generator 80 followed by final amplifier 118' which amplifies the series of pre-amplified pulses 116 to produce a high energy stretched series of pulses 120 that are directed into compressor 122 which compresses the series of amplified pulses to produce a series of high energy output pulses 124.

Figure 7D:
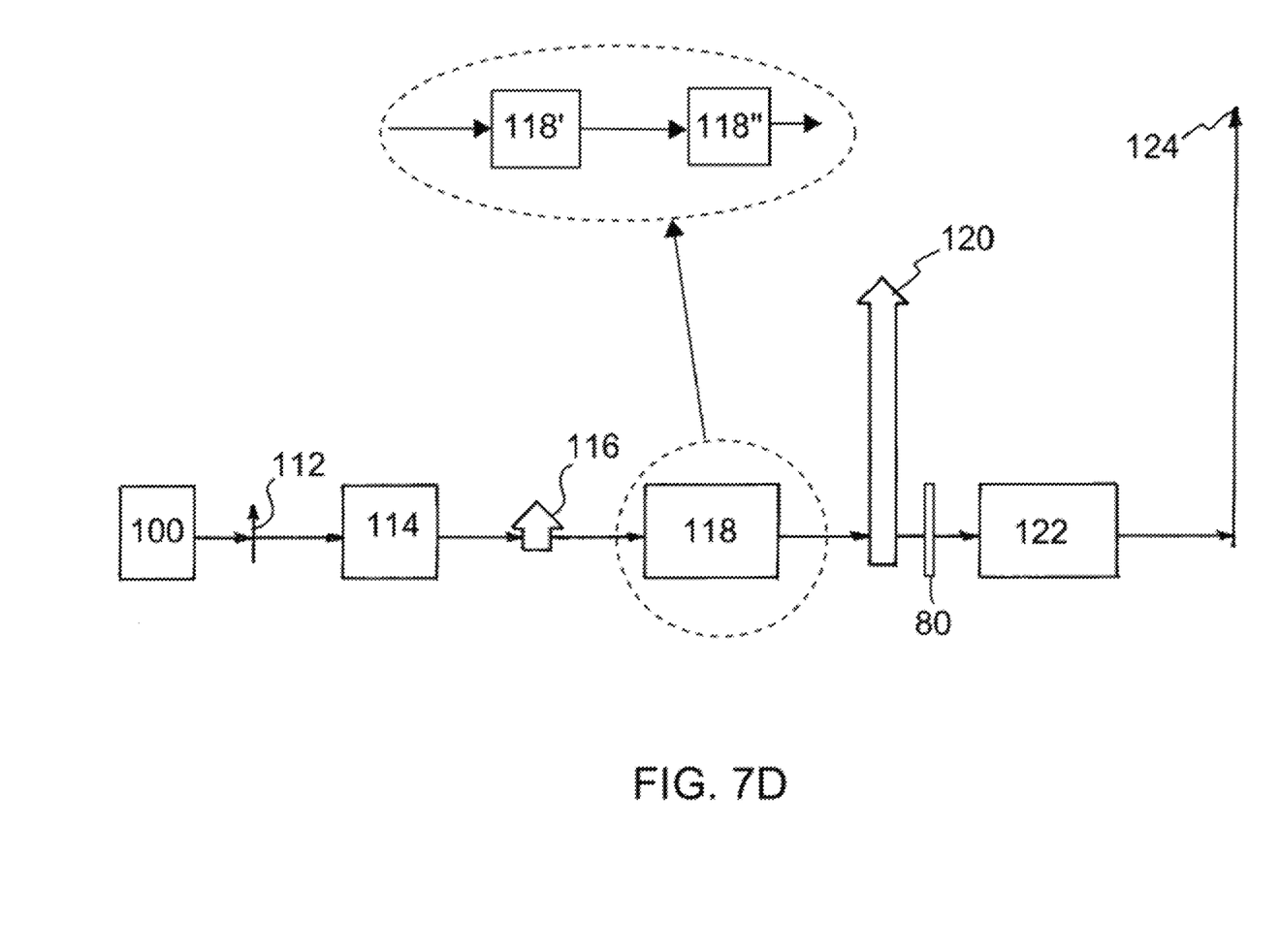

Example 4 of FIG. 7D in general is a block diagram showing a single seed pulse, a stretcher, an amplifier (pre and final), a burst generator, and a compressor. In this configuration, a laser front end 100 produces a low energy short pulse "seed" 112. Seed 112 passes through pulse stretcher 114 to produce a stretched pulse 116 which then passes amplifier 118. Amplifier 118, which may include a preamplifier 118' and a final amplifier 118", amplifies pulse 116 to produce a high energy stretched series of pulses 120. that are directed into Burst generator 80 which produces a series of amplified pulses. Compressor 122 compresses the series of amplified pulses to produce a series of high energy output pulses 124.

The hot electron bursts of this technology can be used to create secondary particle bursts through the interaction of these hot electrons with a suitable target. For instance, high energy photons (x-rays) bursts can be produced by interacting the hot electron burst with a high-Z material. High energy x-rays are often used for flash radiography of dense objects. For sufficiently dense materials, MeV x-rays are desirable.

It is clear that BM-CPA or AMB-CPA, can be used to create multiple images at different time by triggering different BM-CPA or AMB-CPA beamlines at the required image times to produce short pulse bursts; each pulse burst must be focused to a region of the target sufficiently far apart that target fratricide from earlier pulse bursts does not affect a pulse burst later in time. It is also clear that these images can be created along different radiographic axes by aiming the BM-CPA or AMB-CPA beams at targets located at different points of view with respect to the object being radiographed.

Broadly, this writing discloses at least the following.

A method for increasing the MeV hot electron yield and secondary radiation produced by short-pulse laser-target interactions with an appropriately high or low atomic number (Z) target. Secondary radiation, such as MeV x-rays, gamma-rays, protons, ions, neutrons and positrons, can be used, e.g., for the flash radiography of dense objects.

This writing also presents at least the following Concepts.

Concepts:

1. A burst-mode chirped pulse amplification method, comprising:

providing a burst generator;

utilizing said burst generator to produce a series of amplified stretched-duration pulses from a single short-duration pulse; and directing said series of amplified stretched-duration pulses through a pulse compressor to produce a series of amplified short-duration output pulses, wherein each amplified stretched-duration output pulse of said series of amplified stretched-duration pulses is delayed from its immediately preceding amplified stretched-duration output pulse by a delay time that is sufficiently long such that the total optical fluence of said series of amplified stretched-duration pulses that can pass through and not damage said pulse compressor is greater than the minimum optical fluence of a single pulse that would damage said pulse compressor.

2. The method of concepts 1 and 9, wherein the step of utilizing a burst generator comprises:

providing said single short-duration pulse;

directing said single short-duration pulse through said burst generator to produce a series of short-duration pulses, wherein each short-duration pulse of said series of short-duration pulses is delayed from its immediately preceding short-duration pulse by said delay time;

directing said series of short-duration pulses through a pulse stretcher to produce a series of stretched-duration pulses; and directing said series of stretched-duration pulses through an optical amplifier, all during the same gain lifetime of said optical amplifier, to produce said series of amplified stretched-duration pulses, wherein the intensity of each amplified stretched-duration pulse of said series of amplified stretched-duration pulses is below the maximum allowable B-integral limit of the amplifier medium of said optical amplifier.

3. The method of concepts 1 and 9, wherein the step of utilizing a burst generator comprises:

providing said single short-duration pulse;

directing said single short-duration pulse through a pulse stretcher to produce a single stretched-duration pulse;

directing said single stretched-duration pulse through said burst generator to produce a series of stretched-duration pulses, wherein each stretched-duration pulse of said series of stretched-duration pulses is delayed from its immediately preceding stretched-duration pulse by said delay time; and directing said series of stretched-duration pulses through an optical amplifier, all during the same gain lifetime of said optical amplifier, to produce said series of amplified stretched-duration pulses, wherein the intensity of each amplified stretched-duration pulse of said series of amplified stretched-duration pulses is below the maximum allowable B-integral limit of the amplifier medium of said optical amplifier.

4. The method of concepts 1 and 9, wherein the step of utilizing a burst generator comprises:

providing said single short-duration pulse;

directing said single short-duration pulse through rough a pulse stretcher to produce a single stretched-duration pulse;

directing said single stretched-duration pulse through a pre-amplifier to produce a single pre-amplified stretched-duration pulse;

directing said single pre-amplified stretched-duration pulse through said burst generator to produce a series of pre-amplified stretched-duration pulses, wherein each pre-amplified stretched-duration pulse of said series of pre-amplified stretched-duration pulses is delayed from its immediately preceding pre-amplified stretched-duration pulse by said delay time; and directing said series of pre-amplified stretched duration pulses through a final optical amplifier, all during the same gain lifetime of said final optical amplifier, to produce said series of amplified stretched-duration pulses, wherein the intensity of each amplified stretched-duration pulse of said series of amplified stretched-duration pulses is below the maximum allowable B-integral limit of the amplifier medium of said optical amplifier.

5. The method of concepts 1 and 9, wherein the step of utilizing a burst generator comprises:

providing said single short-duration pulse;

directing said single short-duration pulse through a pulse stretcher to produce a single stretched-duration pulse;

directing said single stretched-duration pulse through an optical amplifier to produce a single amplified stretched-duration pulse, wherein the intensity of said amplified stretched-duration pulse is below the maximum allowable B-integral limit of the amplifier medium of said optical amplifier; and directing said single amplified stretched-duration pulse through said burst generator to produce said series of amplified stretched-duration pulses, wherein each amplified stretched-duration pulse of said series of amplified stretched-duration pulses is delayed from its immediately preceding amplified stretched-duration pulse by said delay time.

6. The method of concepts 2 and 9, wherein each said stretched-duration pulse is directed at an angle, different from the angle at which all other said stretched-duration pulses of said series of stretched-duration pulses are directed, through said optical amplifier.

7. The method of concepts 3 and 9, wherein each said stretched-duration pulse is directed at an angle, different from the angle at which all other said stretched-duration pulses of said series of stretched-duration pulses are directed, through said optical amplifier.

8. The method of concepts 4 and 9, wherein each said stretched-duration pulse is directed at an angle, different from the angle at which all other said stretched-duration pulses of said series of stretched-duration pulses are directed, through said optical amplifier.

9. The method of concepts 1-8, further comprising directing and focusing said output pulses onto a target a patterns.

10. the method of concept 9, wherein said pattern focuses each output pulse at a distance on said target from each other output pulse of said output pulses on said target.

11. The method of concept 10, wherein said distance is far enough apart on said target such that said output pulses, or plasma produced by interaction of said output pulses with said target, do not substantially interfere one with the other.

12. The method of concept 9, wherein the step of directing and focusing said output pulses onto a target produces MeV hot electrons.

13. The method of concept 12, wherein said MeV hot electrons interact with said target to produce secondary radiation.

14. The method of concept 13, wherein said secondary radiation is selected from the group consisting of photons and particles.

15. The method of concept 13, wherein said secondary radiation is selected from the group consisting of x-rays, gamma rays, protons, ions, neutrons and positrons.

16. The method of concept 9, wherein said target comprises a material, or a combination of materials, having an appropriate atomic number to produce secondary or tertiary radiation selected from the group consisting of x-rays, gamma rays, protons, ions, neutrons, positrons and electromagnetic radiation in the microwave to sub-mm region.

17. the method of concept 13, further comprising using said secondary radiation in flash radiography.

18. The method of concept 9, further comprising means to reduce the laser plasma interaction between strike points on said target.

19. The method of concept 18, wherein said means comprises recessed areas on said target.

20. The method of concept 18, wherein said means comprises a cone in contact with said target at each place where said output pulses strike said target.

21. The method of concept 20, wherein each said cone comprises plastic.

22. The method of concept 21, wherein said plastic is coated for high reflection.

23. The method of concept 21, wherein said plastic is coated with gold for high reflection.

24. A burst-mode chirped pulse amplifier, comprising:

a chirped pulse amplifier comprising a series of elements located on an optical axis, wherein said series of elements comprises a pulse stretcher, an optical amplifier and a pulse compressor; and a burst generator operatively placed on said optical axis at a location selected from the group consisting of (i) before said pulse stretcher, between said pulse stretcher and said optical amplifier, between stages of said optical amplifier and between said optical amplifier and said pulse compressor.

REFERENCES

1. M. D. Perry, et. al., Rev. Sci. Instrum. 70, 265 (1999)
2. R. D. Edwards, et, al., Appl. Phys. Lett. 80 (2002) 2129.
3. Y. Glinec, et al., Phys. Rev. Lett. 94 (2005) 025003.
4. C. Courtois, et. al., Phys. Plasmas 20 (2011) 023101.
5. C. Courtois, et, al., Phys. Plasmas 20 (2013) 083114.

All elements, parts and steps described herein are preferably included. It is to be understood that any of these elements, parts and steps may be replaced by other elements, parts and steps or deleted altogether as will be obvious to those skilled in the art.

The foregoing description of the technology has been presented for purposes of illustration and description and is not intended to be exhaustive or to limit the technology to the precise form disclosed. Many modifications and variations are possible in light of the above teaching. The embodiments disclosed were meant only to explain the principles of the technology and its practical application to thereby enable others skilled in the art to best use the technology in various embodiments and with various modifications suited to the particular use contemplated. The scope of the technology is to be defined by the following claims.

We claim:

1. A burst-mode chirped pulse amplification method, comprising:
   providing a burst generator;
   utilizing said burst generator to produce a series of amplified stretched-duration pulses from a single short-duration pulse; and
   directing said series of amplified stretched-duration pulses through a pulse compressor to produce a series of amplified short-duration output pulses, wherein each amplified stretched-duration output pulse of said series of amplified stretched-duration pulses is delayed from its immediately preceding amplified stretched-duration output pulse by a delay time that is sufficiently long such that the total optical fluence of said series of amplified stretched-duration pulses that can pass through and not damage said pulse compressor is greater than the minimum optical fluence of a single pulse that would damage said pulse compressor.

2. The method of claim 1, wherein the step of utilizing a burst generator comprises:
   providing said single short-duration pulse;
   directing said single short-duration pulse through said burst generator to produce a series of short-duration pulses, wherein each short-duration pulse of said series of short-duration pulses is delayed from its immediately preceding short-duration pulse by said delay time;
   directing said series of short-duration pulses through a pulse stretcher to produce a series of stretched-duration pulses; and
   directing said series of stretched-duration pulses through an optical amplifier, all during the same gain lifetime of said optical amplifier, to produce said series of amplified stretched-duration pulses, wherein the intensity of each amplified stretched-duration pulse of said series of amplified stretched-duration pulses is below the maximum allowable B-integral limit of the amplifier medium of said optical amplifier.

3. The method of claim 2, wherein each said stretched-duration pulse is directed at an angle, different from the angle at which all other said stretched-duration pulses of said series of stretched-duration pulses are directed, through said optical amplifier.

4. The method of claim 1, wherein the step of utilizing a burst generator comprises:
   providing said single short-duration pulse;
   directing said single short-duration pulse through a pulse stretcher to produce a single stretched-duration pulse;
   directing said single stretched-duration pulse through said burst generator to produce a series of stretched-duration pulses, wherein each stretched-duration pulse of said series of stretched-duration pulses is delayed from its immediately preceding stretched-duration pulse by said delay time; and
   directing said series of stretched-duration pulses through an optical amplifier, all during the same gain lifetime of said optical amplifier, to produce said series of amplified stretched-duration pulses, wherein the intensity of each amplified stretched-duration pulse of said series of amplified stretched-duration pulses is below the maximum allowable B-integral limit of the amplifier medium of said optical amplifier.

5. The method of claim 4, wherein each said stretched-duration pulse is directed at an angle, different from the angle at which all other said stretched-duration pulses of said series of stretched-duration pulses are directed, through said optical amplifier.

6. The method of claim 1, wherein the step of utilizing a burst generator comprises:
   providing said single short-duration pulse;
   directing said single short-duration pulse through a pulse stretcher to produce a single stretched-duration pulse;
   directing said single stretched-duration pulse through a pre-amplifier to produce a single pre-amplified stretched-duration pulse;
   directing said single pre-amplified stretched-duration pulse through said burst generator to produce a series of pre-amplified stretched-duration pulses, wherein each pre-amplified stretched-duration pulse of said series of pre-amplified stretched-duration pulses is delayed from its immediately preceding pre-amplified stretched-duration pulse by said delay time; and
   directing said series of pre-amplified stretched duration pulses through a final optical amplifier, all during the same gain lifetime of said final optical amplifier, to produce said series of amplified stretched-duration pulses, wherein the intensity of each amplified stretched-duration pulse of said series of amplified stretched-duration pulses is below the maximum allowable B-integral limit of the amplifier medium of said optical amplifier.

7. The method of claim 6, wherein each said stretched-duration pulse is directed at an angle, different from the angle at which all other said stretched-duration pulses of said series of stretched-duration pulses are directed, through said optical amplifier.

8. The method of claim 1, wherein the step of utilizing a burst generator comprises:
   providing said single short-duration pulse;
   directing said single short-duration pulse through a pulse stretcher to produce a single stretched-duration pulse;
   directing said single stretched-duration pulse through an optical amplifier to produce a single amplified stretched-duration pulse, wherein the intensity of said amplified stretched-duration pulse is below the maximum allowable B-integral limit of the amplifier medium of said optical amplifier; and
   directing said single amplified stretched-duration pulse through said burst generator to produce said series of amplified stretched-duration pulses, wherein each amplified stretched-duration pulse of said series of amplified stretched-duration pulses is delayed from its immediately preceding amplified stretched-duration pulse by said delay time.

9. The method of claim 1, further comprising directing and focusing said output pulses onto a target in a pattern.

10. The method of claim 9, wherein said pattern focuses each output pulse at a distance on said target from each other output pulse of said output pulses on said target.

11. The method of claim 10, wherein said distance is far enough apart on said target such that said output pulses, or plasma produced by interaction of said output pulses with said target, do not substantially interfere one with the other.

12. The method of claim 9, wherein the step of directing and focusing said output pulses onto a target produces MeV hot electrons.

13. The method of claim 12, wherein said MeV hot electrons interact with said target to produce secondary radiation.

14. The method of claim 13, wherein said secondary radiation is selected from the group consisting of photons and particles.

15. The method of claim 13, wherein said secondary radiation is selected from the group consisting of x-rays, gamma rays, protons, ions, neutrons and positrons.

16. The method of claim 13, further comprising using said secondary radiation in flash radiography.

17. The method of claim 9, wherein said target comprises a material, or a combination of materials, having an appropriate atomic number to produce secondary or tertiary radiation selected from the group consisting of x-rays, gamma rays, protons, ions, neutrons, positrons and electromagnetic radiation in the microwave to sub-mm region.

18. The method of claim 9, further comprising means to reduce a laser plasma interaction between strike points on said target.

19. The method of claim 18, wherein said means comprises recessed areas on said target.

20. The method of claim 18, wherein said means comprises a cone in contact with said target at each place where said output pulses strike said target.

21. The method of claim 20, wherein each said cone comprises plastic.

22. The method of claim 21, wherein said plastic is coated for high reflection.

23. The method of claim 21, wherein said plastic is coated with gold for high reflection.

24. A burst-mode chirped pulse amplifier, comprising:
a chirped pulse amplifier comprising a series of elements located on an optical axis, wherein said series of elements comprises a pulse stretcher, an optical amplifier and a pulse compressor; and
a burst generator operatively placed on said optical axis at a location selected from the group consisting of before said pulse stretcher, between said pulse stretcher and said optical amplifier, between stages of said optical amplifier and between said optical amplifier and said pulse compressor;
wherein the burst-mode chirped pulse amplifier is configured to produce a series of amplified stretched-duration pulses from a single short-duration pulse; and
wherein the burst-mode chirped pulse amplifier is configured so that each amplified stretched-duration output pulse of said series of amplified stretched-duration pulses is delayed from its immediately preceding amplified stretched-duration output pulse by a delay time that is sufficiently long such that the total optical fluence of said series of amplified stretched-duration pulses that can pass through and not damage said pulse compressor is greater than the minimum optical fluence of a single pulse that would damage said pulse compressor.

25. The burst-mode chirped pulse amplifier of claim 24, wherein the burst-mode chirped pulse amplifier is configured to direct each said amplified stretched-duration pulse at a respective angle through said optical amplifier, wherein the respective angle is different from any angle at which all other said amplified stretched-duration pulses of said series of amplified stretched-duration pulses are directed through said optical amplifier.

* * * * *